(12) United States Patent
Bakowski et al.

(10) Patent No.: US 6,313,488 B1
(45) Date of Patent: Nov. 6, 2001

(54) BIPOLAR TRANSISTOR HAVING A LOW DOPED DRIFT LAYER OF CRYSTALLINE SIC

(75) Inventors: Mietek Bakowski, Södertälje; Bo Breitholtz, Västerås; Ulf Gustafsson, Linköping; Lennart Zdansky, Västerås, all of (SE)

(73) Assignee: ABB Research Limited, Zurich (CH)

( * ) Notice: Subject to any disclaimer, the term of this patent is extended or adjusted under 35 U.S.C. 154(b) by 0 days.

(21) Appl. No.: 09/333,296

(22) Filed: Jun. 15, 1999

(30) Foreign Application Priority Data

Apr. 21, 1999 (SE) .................................................. 9901410

(51) Int. Cl.$^7$ ........................ H01L 29/737; H01L 27/082
(52) U.S. Cl. ........................... 257/198; 257/77; 257/197; 257/586; 257/592
(58) Field of Search .............................. 257/77, 197, 198, 257/586, 592

(56) References Cited

U.S. PATENT DOCUMENTS

| | | | |
|---|---|---|---|
| 4,945,394 | * 7/1990 | Palmour et al. | 257/586 |
| 5,319,220 | * 6/1994 | Suzuki et al. | 257/77 |
| 5,641,975 | 6/1997 | Agarwal et al. | 257/77 |
| 5,847,414 | * 12/1998 | Harris et al. | 257/77 |

OTHER PUBLICATIONS

Danielson et al "Simulation and Electrical Characterization of GaN/SiC and AlGAN/SiC Heterodiodes" Materials Science and Engineering, B61–62 (1999) pp. 320–324.*

Fardi et al. "Numerical Modelling and Characterization of High Frequency High–Power High–Temperature GaN/SiC Heterostructure Bipolar Transistors" International Journal Electronics, 1997, vol. 82, pp. 567–574.*

Physics of Semiconductor Devices (Second Edition); S.M. Sze, Bell Laboratories, Inc., Murray Hill, New Jersey, 1981, pp. 304–306.

Danielsson, E., et al., "Simulation Study of on–state Losses as Function of Carrier Life–time for a GaN/SiC High Power HBT Design", Physica Scripta, vol. T79, pp. 290–293, 1999.

Pankove, J.I., et al., "High–Power High–Temperature Heterobipolar Transistor With Gallium Nitride Emitter", MRS Internet Journal Nitride Semiconductor Research, vol. 1, Article 39, pp. 1–5, 1996.

Torvik, John T., et al., "Optical characterization of GaN/SiC n–p heterojunctions and p–SiC", Applied Physics Letters, vol. 72, No. 8, pp. 945–947, Feb. 1998.

Torvik, John T., et al., "A GaN/4H–SiC heterojunction bipolar transistor with operation up to 300° C.", MRS Internet Journal Nitride Semiconductor Research, pp. 1–6, 1999, vol. 4, Article 3.

* cited by examiner

*Primary Examiner*—Gene M. Munson
(74) *Attorney, Agent, or Firm*—Connolly Bove Lodge & Hutz

(57) ABSTRACT

A bipolar transistor having at least a low doped drift layer (14) of crystalline SiC comprises at least one first layer (13) of a semi-conductor material having a wider energy gap between the conduction band and the valence band than an adjacent layer (14) of SiC.

17 Claims, 4 Drawing Sheets

BIPOLAR TRANSISTOR HAVING A LOW DOPED DRIFT LAYER OF CRYSTALLINE SIC

FIELD OF THE INVENTION AND PRIOR ART

The present invention relates to a bipolar transistor having at least a low doped drift layer of crystalline SiC.

SiC has some excellent physical properties, such as a high thermal stability, a high thermal conductivity and especially a high breakdown field being approximately ten times higher than for Si, which makes SiC well suited as a material for high power devices operating under conditions were high voltages may occur in the blocking state of the device. The high breakdown field makes it possible to make transistors of SiC comparatively thin and still able to hold high voltages in the blocking state thereof reducing on-state losses.

The present invention is particularly occupied with bipolar transistors for high power applications, specifically in the fields of distribution and transmission of electric energy, for example in converters of different types as in HVDC converter stations, and will hereinafter be explained with respect thereto, but the invention should not be considered to be restricted to transistors for handling high powers and/or voltages. Other possible applications are for example as current breakers and current limiters.

"Drift layer" as defined above is to be interpreted broadly and may be a part of the collector as well as of the base in some designs of such transistors.

This type of transistor already known is normally called Bipolar Junction Transistor (BJT) and a major drawback of such transistors already known for high power applications is the high control current that must be supplied to the contact for the base of the transistor. To achieve a low control current the base width must be very small, but a thin base layer suffers from punch-through breakdown unless the doping is high. A high base doping lowers the emitter injection efficiency and this increases the control current. This means in practice that a high control current must be supplied to the base contact in the on-state of the transistor resulting in unnecessarily and mostly unacceptably high power losses.

SUMMARY OF THE INVENTION

The object of the present invention is to provide a bipolar transistor of the type defined in the introduction, which operates more efficiently, i.e. with low on state losses and low base current, than such transistors already known and in which the drawbacks discussed above are reduced.

This object is according to the invention obtained by providing such a transistor with at least one first layer of a semiconductor material having a wider energy gap between the conduction band and the valence band than an adjacent layer of SiC. Accordingly, such a transistor may be called a Heterojunction Bi-polar Transistor (HBT), since it will have semiconductor layers of at least two different materials. However, it is emphasized that this definition also comprises the case of forming said semiconductor material with a wider bandgap by a polytype of SiC having a wider bandgap than the polytype of SiC used for an adjacent layer.

It has been found that the introduction of such a first layer of such a wider bandgap material will make it possible to reduce the on-state losses of the transistor by making it possible to obtain the on-state of the transistor by using a lower base current than would be necessary for a bipolar transistor with all the layers made of the same semiconductor material of crystalline siC.

According to a first preferred embodiment of the invention the emitter of the transistor is one said first layer. This results in a heterojunction between the emitter and the base, and this heterojunction will maintain a high carrier injection from the emitter through a low barrier therefore and suppresses the carrier injection from the base thanks to an increased valence band barrier against such injection, even with high base doping, solving the problem of a high base doping in an ordinary bipolar transistor resulting in a low emitter injection efficiency and an increased base control current.

According to another preferred embodiment of the invention the transistor comprises a continues base layer doped according to a first conductivity type and physically separating the emitter and the collector of the transistor, which are doped according to an opposite, second conductivity type, and means are arranged next to an electrode making contact to the base layer for introducing an energy barrier for minority charge carriers injected into the base layer from the emitter for reducing recombination of such minority charge carriers at the base contact electrode. It has been found that it is not possible to achieve full benefit of the HBT-structure with an heterojunction between the emitter and the base without solving the problem of recombination of minority charge carriers at the base contact. If this is not done the benefits of the HBT-structure may be lost, since a great part of the minority charge carriers injected into the base layer from the emitter will be "absorbed" by the base contact through re-combination with opposite charge carriers. This results in a higher collector-emitter voltage at a given base current, i.e. a higher base current is needed for a certain collector-emitter voltage. However, this problem is solved by the introduction of said means forming an energy barrier for the minority charge carriers resulting in a diversion of such charge carriers coming close to the base contact in the direction of the collector instead.

According to another preferred embodiment of the invention said means are formed by a sub-layer of said base layer located next to said contact electrode and having a higher doping concentration of said first conductivity type than the rest of the base layer, and a further preferred embodiment of the invention has said means formed by the arrangement of one said first layer next to the base layer for forming the base layer contact electrode and which is doped according to the first conductivity type, so that the energy barrier for the minority charge carriers will in the first case be formed by said higher doping concentration and in the second case by the introduction of a heterojunction at the base contact, and both measures will efficiently decrease electron re-combination at the base contact.

According to another preferred embodiment of the invention the base of the transistor is formed by a grid doped according to a first conductivity type and buried in the drift layer doped according to an opposite, second conductivity type while leaving drift layer regions between adjacent grid bars, the emitter and the collector of the transistor being also doped according to said second conductivity type. A bipolar transistor with this totally new design will also have the on-state losses efficiently reduced. This is mainly achieved by the fact that the charge carriers injected into the drift layer from the emitter has not to be transported in any layer in which they are minority charge carriers, which means a longer life time of the charge carriers. It will also be possible to obtain the plasma in the drift layer at a lower current of charge carriers of the first conductivity type, so that the base control current needed for obtaining a low collector-emitter voltage will be reduced. This means in the case of an emitter of n-type and accordingly a base layer of p-type that the electrons injected from the emitter have not to be transported through a p-doped region and possible limitations of very low life-times in the highly doped p-base of standard HBT due to re-combination central in e.g. B- and Al-doped SiC, are avoided, and the plasma may be obtained at a lower hole current supplied through the grid.

According to another preferred embodiment of the invention being a further development of the embodiment last mentioned the transistor comprises two base grids, one arranged close to the emitter and the other close to the collector, so that the transistor is bi-directional with respect to current conduction and turn-off capabilities and the base grid closest to the emitter in the respective type of operation of the transistor is arranged to be used to control the transistor. Accordingly, this will make the operation of the transistor more flexible and broaden the possible applications thereof. There will also be a possibility of an increased injection of holes from the anode-side of the diode, which will give a further reduction of the on-state losses.

According to another preferred embodiment of the invention the base grid is one said first layer. This will reduce the base current needed for obtaining the low on-state voltage aimed at, and so will the design of the emitter as one said first layer, and it is particularly advantageous that both the base grid and the emitter are a said first layer of a material having a wider energy gap between the conduction band and the valence band than the SiC of the drift layer, which reduces the base current needed for a low collector-emitter voltage drastically, well by more than an order of magnitude.

According to another preferred embodiment of the invention the different grid bars extend vertically to the surface of the transistor and emitter portions are arranged on regions of said surface between adjacent grid bar surfaces. This design may be preferred when it is desired to produce the grid bars by high energy implantation of dopants into the drift layer, but it would also be possible to have the grid bars vertically separated from said surface when using the regrowth technique for the production thereof.

According to another preferred embodiment of the invention the lateral distance between adjacent grid bars in the drift layer is selected so that the drift layer portions separating adjacent grid bars will be completely depleted when a voltage exceeding 300 V, preferably already when exceeding 200 V, is applied in the reverse direction between the emitter and the collector of the transistor. This means that a continuous layer of said first conductivity type forming a blocking pn-junction will be created at a comparatively low voltage, so that the space charge region may then grow vertically and take a much higher voltage, well above 10 kV in the blocking state of the diode.

According to another preferred embodiment of the invention said first layer has a group 3-B-Nitride as major component and it is particularly preferred to use $Al_xGa_{1-x}N$ as said major component. Such a semiconductor material will have a wider bandgap than SiC and a good lattice match to SiC, so that a high quality interface may be formed at the heterojunction, which is essential, since would such an interface be bad the advantage of the heterojunction will be totally lost as a consequence of a high rate of recombinations of charge carriers at interface traps. AlN has the best lattice match of all these components to SiC, and the mismatch to 6 H SiC is as low as 0.7%. Accordingly, it may be preferable to have x high close to the heterojunction, but the difficulty, in any case so far, to dope AlN makes GaN otherwise more suitable as said material for the first layer, and it is preferred that x is less than 0.2 for obtaining a sufficiently high concentration of dopants in said first layer. Accordingly, the choice of x is a compromise between lattice match and doping level, and this problem may in the future be solved when impurity doping is more developed. As a consequence of this, a transistor according to a preferred embodiment of the invention has the junction between said first layer and a layer of SiC adjacent thereto graded with x decreasing in the direction away from said adjacent layer of SiC. Such a construction of said first layer enables a combination of an excellent lattice match to the adjacent layer of SiC and a doping concentration being high enough. Another way of solving this problem is to provide said first layer with a thin sub-layer of AlN forming an interface between said first layer and an adjacent layer of SiC. Such a sub-layer may be very thin, in the order of atom layers.

Further preferred characteristics and advantages of the invention will appear from the following description and the other dependent claims.

BRIEF DESCRIPTION OF THE DRAWINGS

With reference to the appended drawings, below follows a specific description of preferred embodiments of the invention cited as examples.

In the drawings.

DETAILED DESCRIPTION OF PREFERRED EMBODIMENTS OF THE INVENTION

Figure 1:
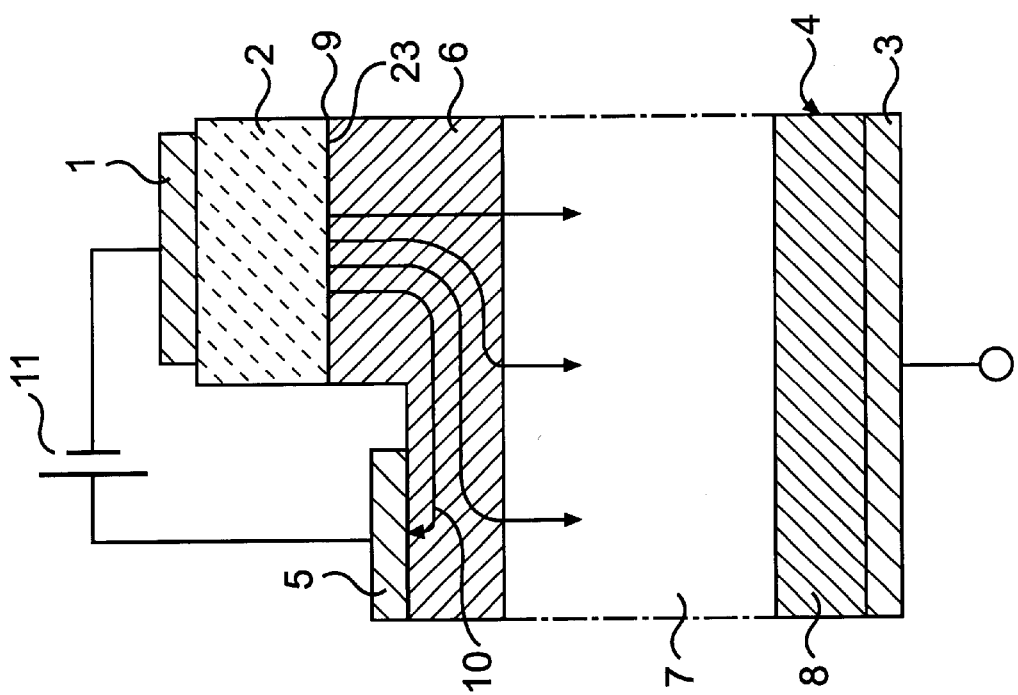
FIG. 1 is a schematic cross-section view of a Heterojunction Bipolar Transistor (HBT) according to a first preferred embodiment of the invention.

A Heterojunction Bipolar Transistor made of SiC, for instance of the 4H-polytype, is schematically illustrated in FIG. 1. However, it should be noticed that the relative dimensions of the regions in this device shown in this figure and also in the other figures have only been chosen for the sake of clearness of the drawing.

This transistor has three electrodes, namely one electrode 1 making contact to an emitter 2, an electrode 3 making contact to a collector 4 and an electrode 5 making contact to a base 6. The emitter 2 is doped according to a first conductivity type, and this first conductivity type will hereinafter be considered to be n-type throughout the description, but it is emphasized that it will be possible to exchange the conductivity types of all layers in all different embodiments to the opposite. In obtaining numerical values shown in FIGS. 5 and 7 following typical values of dopings and layer thicknesses were used for the sake of illustration. The doping concentration of the emitter is $5.10^{18} cm^{-3}$. The base 6 is p-type doped and may for instance have a doping concentration of $10^{14} cm^{-3}$, whereas the collector 4 is of n-type and comprises a low doped drift-layer 7 of a doping concentration of about $10^{14} cm^{-3}$ and a high doped layer 8 of a doping concentration of about $10^{18} cm^{-3}$. The base and the collector are of SiC, whereas the emitter is of a semiconductor material having a wider energy gap between the valence band and the conduction band than SiC in the base layer 6, and it is preferably $Al_xGa_{1-x}N$, which makes it possible to vary the bandgap from 3.33 eV (GaN) to 6.2 eV (AlN). It may have a thin sub-layer 23 of AlN next to the base for improving the interface thereto. The thickness of the layers may be as follows: 2:1 μm, 6:1 μm, 7:100 μm and 8:2 μm.

Figure 2:
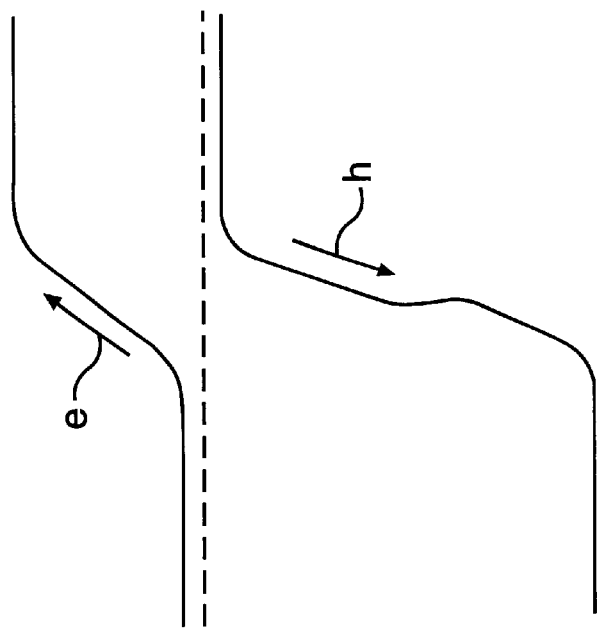
FIG. 2 is a band diagram of the heterojunction between the emitter and the base in the transistor according to FIG. 1.

FIG. 2 shows the band bending of a heterojunction 9 at equilibrium. In this example the band offset is located entirely at the valence band, which is desired when the junction should reject holes. The base-emitter heterojunction 9 will in this way maintain a high majority carrier injection from the emitter and at the same time suppress the minority carrier injection from the base due to increased energy barrier for holes. The arrows e and h represents the way to go by the electrons and holes, respectively, for passing the heterojunction. Although this transistor is efficient it is not possible to achieve full benefit of the advantageous structure explained by FIG. 2, since a part of the electrons injected into the base layer will reach the region of the base contact 5, as illustrated by the arrow 10, where they will recombine with holes. This means that the base control current caused by applying a voltage (see source 11) between the emitter and the base have to be comparatively high for obtaining a sufficient injection of electrons from the emitter to the base for obtaining a low collector-emitter voltage in the on-state of the transistor.

Figure 3:
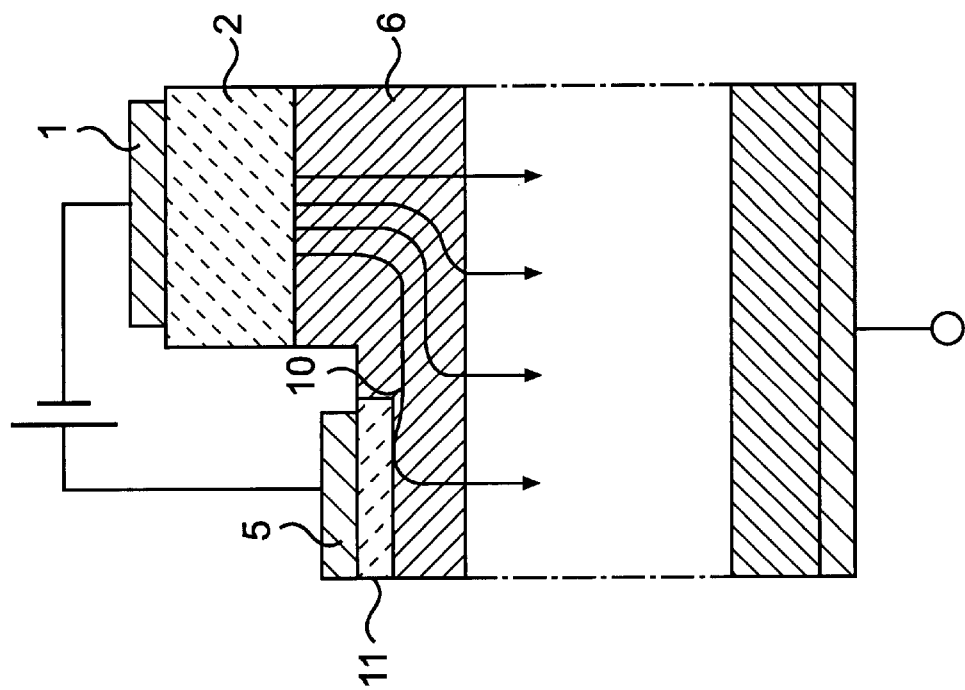
FIG. 3 is a view corresponding to FIG. 1 of a transistor according to a second preferred embodiment of the invention.

FIG. 3 illustrates a Heterojunction Bipolar Transistor according to a second preferred embodiment of the invention, which constitutes a preferred development of the embodiment shown in FIG. 1 and addresses the problem discussed above and achieve full benefit of the heterojunction in the embodiment according to FIG. 1. This transistor differs from that according to FIG. 1 by the arrangement of a sub-layer 11 of the base layer 6 next to the contact electrode 5 and having a higher p-type doping concentration than the rest of the base layer. It may for instance have a doping concentration of one or two orders of magnitude higher than the base layer, accordingly $10^{19}-10^{20} cm^{-3}$. This means that an energy barrier for the electrons is introduced, which will divert the electrons following the arrow 10 away from the contact electrode 5 and towards the collector, so that the re-combination of electrons injected into the base layer will be considerably reduced and a low on-state voltage be achieved at a lower base current.

Figure 4:
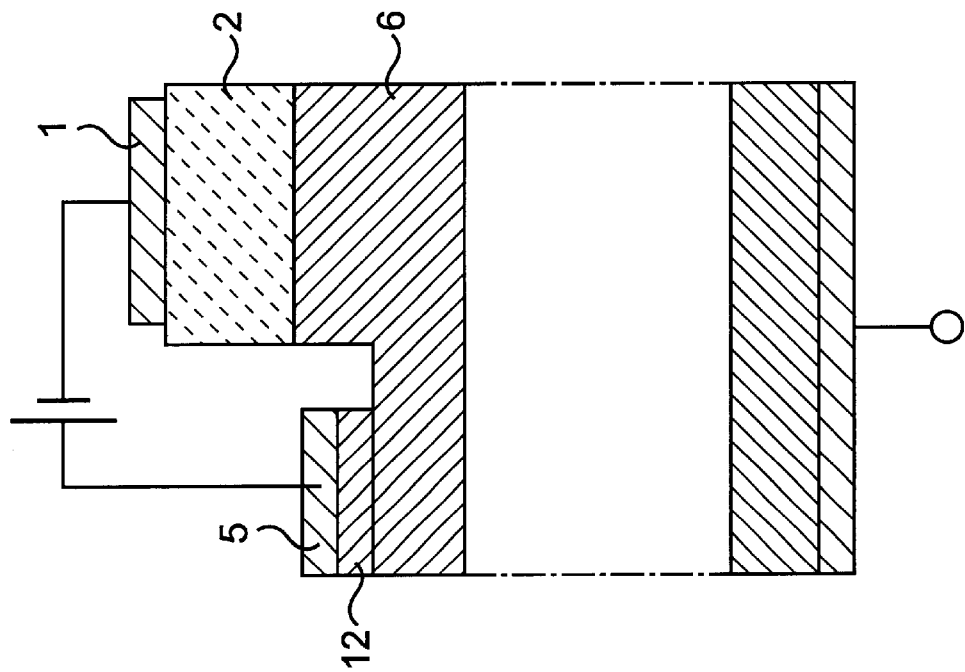
FIG. 4 is a view of a transistor according to a third preferred embodiment of the invention.

The embodiment of the transistor shown in FIG. 4 differs from that according to FIG. 3 by the arrangement of an additional layer 12 on top of the base layer of a semiconductor material having a wider bandgap than the SiC of the base layer and being p-type doped, for instance of any of the materials discussed above for the emitter, and this layer 12 will have the same function as the layer 11 according to FIG. 3, namely form an energy barrier for the electrons and diverting them towards the collector.

Figure 5:
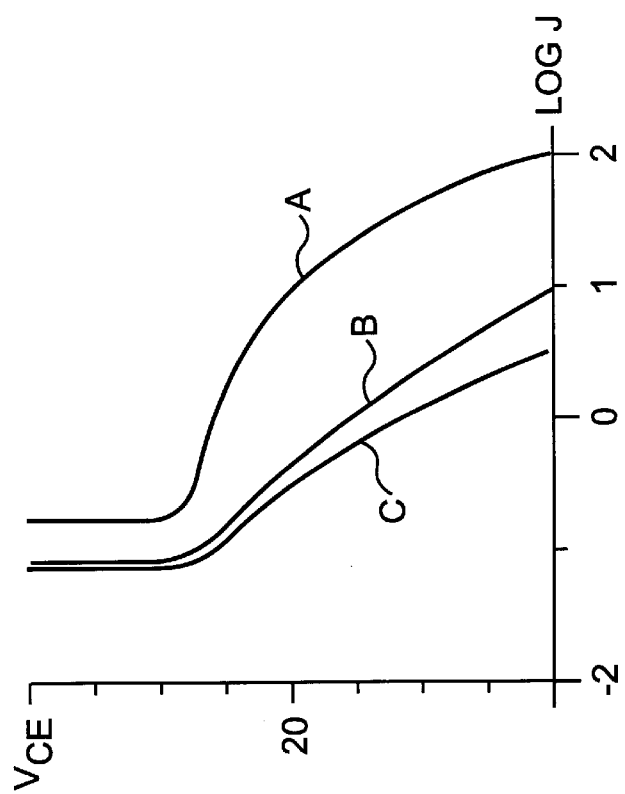
FIG. 5 is a diagram of the collector-emitter voltage. versus the logarithm of the base current density for a transistor according different embodiments of the invention.

The collector-emitter voltage in volts versus the logarithms (with 10 as base) of the base current density in $A/cm^2$ is illustrated in FIG. 5 for a) a transistor according to FIG. 1, b) a transistor according to FIG. 4 and c) the ideal one-dimensional Heterojunction Bipolar Transistor at constant collector current density of 100 $A/cm^2$. The blocking capability of the structure is 10 kV and the assumed carrier lifetime in the drift region is 10 μs. It may be mentioned that the curve b will nearly completely correspond to the curve for the embodiment according to FIG. 3. It is illustrated how the base current density for obtaining the low collector-emitter voltage of approximately 0.2 V is reduced by more than one order of magnitude, i.e. more than a factor 10, through the arrangement of the energy barrier close to the base contact.

Figure 6:
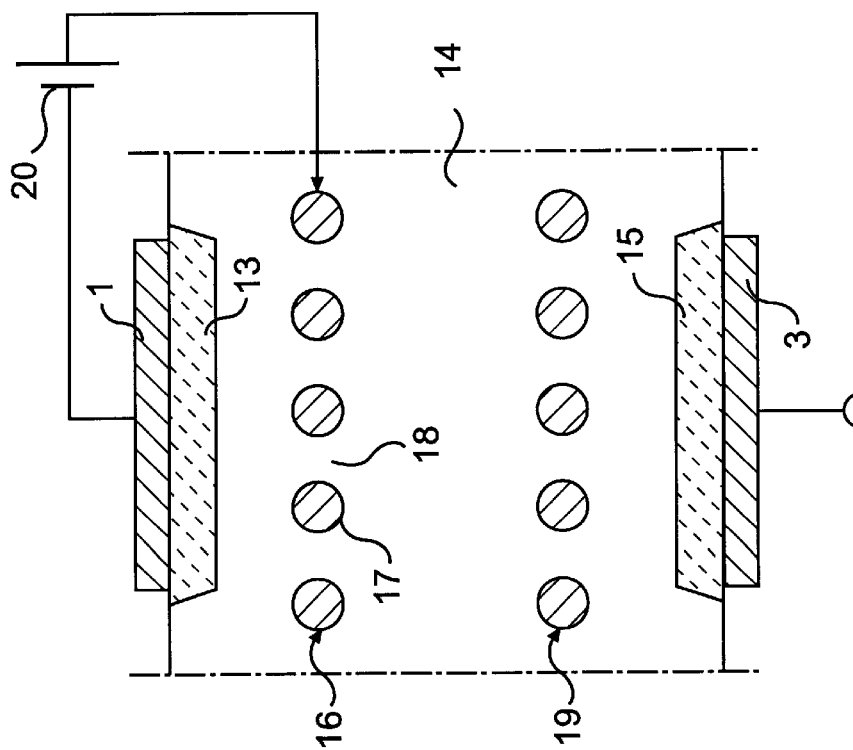
FIG. 6 is a view corresponding to FIG. 1 of a transistor according to a fourth preferred embodiment of the invention.

A bipolar transistor according to a fourth preferred embodiment of the invention is schematically illustrated in FIG. 6, and this has a n-type emitter 13, a low doped n-type drift layer 14 and a n-type collector 15. Furthermore, it comprises a base 16 formed by a p-type grid buried in the drift layer at a distance from the emitter 13. Adjacent grid bars 17 leave drift layer regions 18 therebetween. The emitter as well as the collector are made of a semiconductor material having a wider bandgap than the drift layer made of crystalline SIC, for example of the 4H polytype. Furthermore, a further grid 19 corresponding to the grid 16 is buried in the drift layer at a distance to the collector 15 corresponding to the distance between the grid 16 and the emitter 13. Accordingly, the transistor has a lateral symmetry line dividing it into two identical parts, so that it may be operated bi-directionally. Accordingly, it will be possible to apply a base voltage to the grid 19, which will then be the base and have the layer 15 as emitter and the layer 13 as collector. Thus, we will achieve bidirectional current conduction and bidirectional turn-off capabilities. Furthermore, the electrons injected into the drift layer from the emitter have not to be transported through any highly doped p-type region, characterized by a reduced carrier lifetime, and a lower base current will be needed to obtain a conducting plasma in the drift layer due to its higher carrier lifetime. It is in FIG. 6 schematically illustrated how a voltage source 20 is applied to the grids 16, 17 and there will when desired be a corresponding voltage source for the grid 19. This type of device may be called Grid HBT.

The lateral distance between adjacent grid bars in the drift layer is selected so that the drift layer portions 18 separating adjacent grid bars will be completely depleted when a voltage of 100–200 V is applied, so that the space charge region may then grow vertically and take up a blocking voltage of for instance 10 kV.

Figure 7:
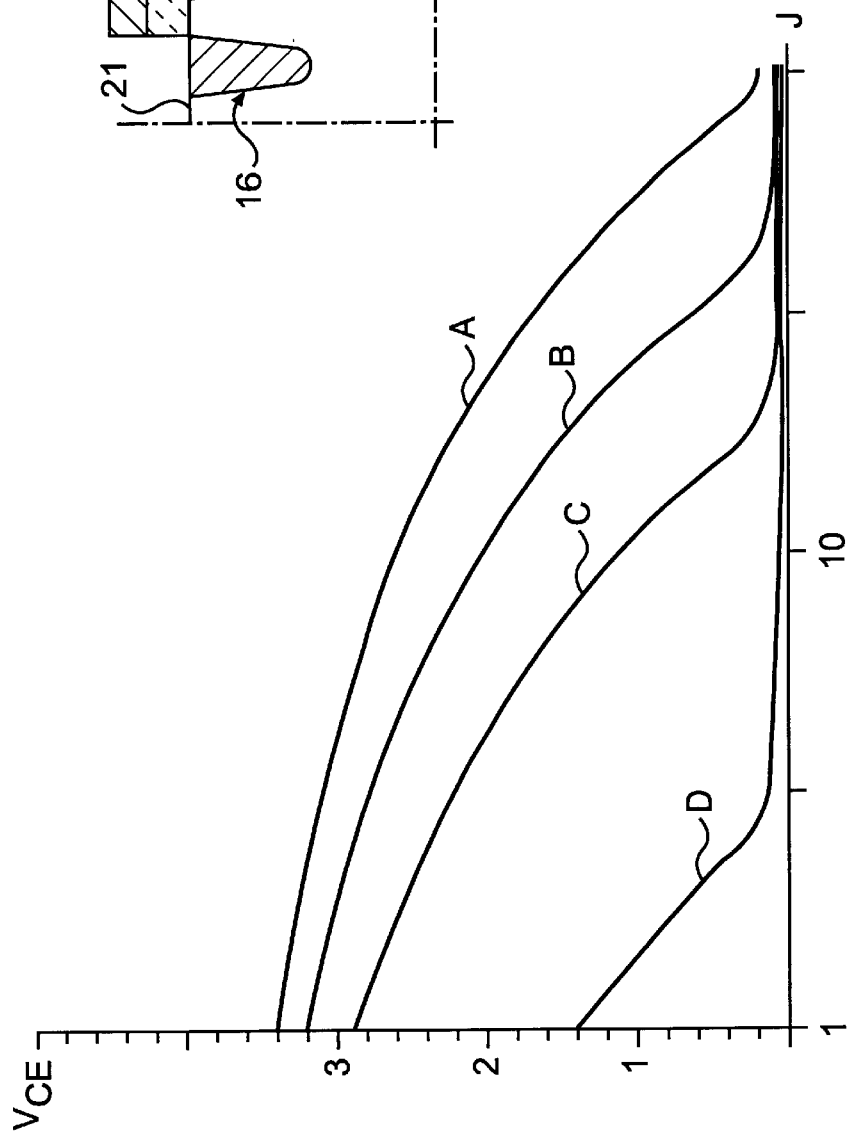
FIG. 7 is a diagram of the collector-emitter voltage versus grid current density of different transistors according to the invention of the type shown in FIG. 6.

The diagram in FIG. 7 illustrates the collector-emitter voltage in volts of a transistor according to FIG. 6 versus the base current density in $A/cm^2$ at constant collector current density of 100 $A/cm^2$ for a) the case of a prior art conventional grid BJT (or grid SIT), b) the case that the grid is formed of GaN, i.e. a semiconductor material having a wider gap between the valence band and the conduction band than SiC, c) only the emitter is of GaN and d) both the base grid and the emitter are of GaN. It is shown how the base current needed for obtaining the on-state of the transistor may be more and more reduced by taking the measures according to b), c) and finally d). The blocking capability of the structure is 10 kV and the assumed carrier lifetime in the drift region is 10 μs.

Figure 8:
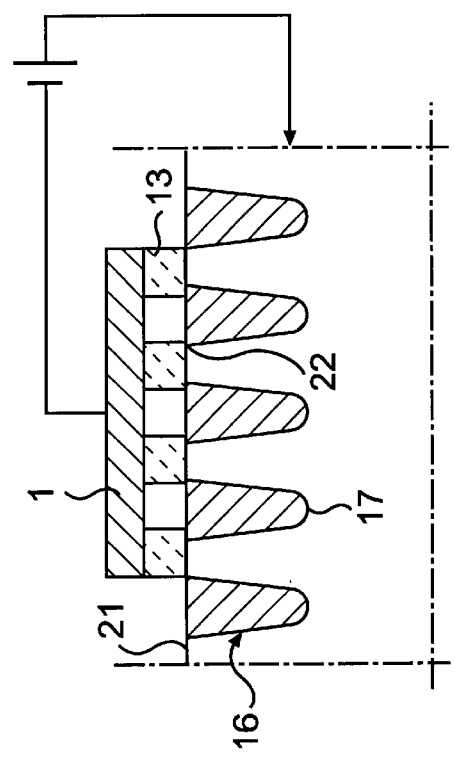
FIG. 8 is a view corresponding to FIG. 1 of a part of a transistor according to a fifth preferred embodiment of the invention being a modification of the transistor according to FIG. 6.

FIG. 8 illustrates a transistor according to an embodiment differing from that shown in FIG. 6 by the fact that the grid bars extend vertically to the surface 21 of the transistor and emitter portions 13 are arranged on regions of said surface between adjacent grid bar surfaces 22. This transistor will function according to the same principle as the one shown in FIG. 6, and it may also be made bi-directional. However, it may with some process equipment be easier to achieve, i.e. it may be achieved through less processing steps, and in the case of a grid formed of SiC, this may be achieved by high energy implantation of p-type dopants into a drift layer formed before by epitaxial growth.

Suitable p-type dopants will for SiC be B and Al and N may preferably be used as n-type dopant inevitably introduced into the layers of SiC in any way during the epitaxial growth thereof.

The invention is of course not in any way restricted to the preferred embodiments described above, but many possibilities to modifications thereof would be apparent to a man with ordinary skill in the art without departing from the basic idea of the invention as defined in the claims.

It should be noticed that the material definitions made above and in the claims of course also include inevitable impurities.

It is for example also possible to have only one grid in a device of the type shown in FIGS. 6 and 8, so that it will then be uni-directional.

"Transistor" is here and in the claims to be interpreted to also cover the case of arrangement of an additional layer doped according to the first conductivity type under the collector, i.e. in for example the embodiment of FIG. 3 a highly doped p-type layer, for obtaining a thyristor-like device.

It would also be possible to vary the doping concentration of the drift layer 7, 14 in the vertical direction.

Another possible measure for controlling the conducting properties is to lower the charge carrier lifetime in the drift layer 7, 14 to a desired level. This may be achieved for instance by irradiation thereof by electrons, protons or ions of a high energy.

It will also be possible to use other materials than those mentioned above for the first layer for obtaining a graded junction between this layer and an adjacent layer of SiC for achieving an optimum combination of lattice-match to SiC (excellent interface with a low trap density) and a wider energy band gap than SiC.

What is claimed is:

1. A bipolar transistor having at least a low doped drift layer (7, 14) of crystalline SiC characterized in that it comprises:
   at least one first layer (2, 12, 13, 15, 16, 19) of a semiconductor material having a wider energy gap between the conduction band and the valence band than an adjacent layer of SiC, wherein the emitter (2, 13, 15) of the transistor is one said first layer;
   a continuous base layer (6) doped according to a first conductivity type and physically separating the emitter (2) and the collector (4) of the transistor, which are doped according to an opposite, second conductivity type; and
   an energy barrier means (11, 12) is arranged next to an electrode, making contact to the base layer, for introducing an energy barrier for minority charge carriers injected into the base layer from the emitter for reducing recombination of such minority charge carriers at the base contact electrode.

2. A transistor according to claim 1, characterized in that said means are formed by a sub-layer (11) of said base layer (6) located next to said contact electrode (5) and having a higher doping concentration of said first. conductivity type than the rest of the base layer.

3. A transistor according to claim 1, characterized in that said means are formed by the arrangement of one said first layer (12) next to the base layer (6) for forming the base layer contact electrode and which is doped according to the first conductivity type.

4. A transistor according to any of claim 3, characterized in that said first layer (2, 12, 13, 15, 16, 19) has a group 3B-Nitride as major component.

5. A transistor according to claim 4, characterized in that said first layer (2, 12, 13, 15, 16, 19) has $Al_xGa_{1-x}N$ as said major component.

6. A transistor according to claim 5, characterized in that x is less than 0.2.

7. A transistor according to claim 5, characterized in that the junction (9) between said first layer and a layer of SiC adjacent thereto is graded with x decreasing in the direction away from said adjacent layer of SiC.

8. A transistor according to any of claim 5, characterized in that said first layer (2, 12, 13, 15, 16, 19) comprises a thin sub-layer of AlN forming an interface between said first layer and an adjacent layer of SiC.

9. A transistor according to any of claim 1, characterized in that said first layer is made of crystalline SiC of another polytype than an adjacent layer of SiC.

10. A use of a transistor according to any of claim 1 for high power and/or high voltage applications.

11. A use according to claim 10, characterized in that it is designed to be able to hold a voltage higher than 5 kV when reversed biased.

12. A bipolar transistor having at least a low doped drift layer (7, 14) of crystalline SiC characterized in that it comprises:
   at least one first layer (2. 12, 13, 15, 16, 19) of a semiconductor material having a wider energy gap between the conduction band and the valence band than an adjacent layer of SiC; and
   the base of the transistor is formed by a grid (16, 19) doped according to a first conductivity type and buried in the drift layer (14) doped according to an opposite, second conductivity type while leaving drift layer regions (18) between adjacent grid bars (17), wherein the emitter (13) and the collector (15) of the transistor are also doped according to said second conductivity type.

13. A transistor according to claim 12, characterized in that it comprises two base grids, one (16) arranged close to the emitter and the other (19) close to the collector, so that the transistor is bidirectional with respect to current conduction and turn-off capabilities and the base grid closest to the emitter in the respective type of operation of the transistor is arranged to be used to control the transistor.

14. A transistor according to claim 12, characterized in that the base grid (16, 19) is one said first layer.

15. A transistor according to claim 14, characterized in that both the base grid (16, 19) and the emitter (13, 15) are a said first layer of a material having a wider energy gap between the conduction band and the valence band than the SiC of the drift layer.

16. A transistor according to any of claims 12, characterized in that the different grid bars extend vertically to the surface (17, 21) of the transistor and emitter portions (13) are arranged on regions of said surface between adjacent grid bar surfaces (22).

17. A transistor according to claim 12, characterized in that the lateral distance between adjacent grid bars (17) in the drift layer (14) is selected so that the drift layer regions (18) separating adjacent grid bars will be completely depleted when a voltage exceeding 200 V is applied in the reverse direction between the emitter and the collector of the transistor.

* * * * *